US011175341B2

(12) United States Patent
Legnedahl et al.

(10) Patent No.: US 11,175,341 B2
(45) Date of Patent: Nov. 16, 2021

(54) METHOD AND ARRANGMENT FOR CLASSIFYING A VOLTAGE FAULT CONDITION IN AN ELECTRICAL STORAGE SYSTEM

(71) Applicant: VOLVO TRUCK CORPORATION, Gothenburg (SE)

(72) Inventors: Niklas Legnedahl, Onsala (SE); Hanna Bryngelsson, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 210 days.

(21) Appl. No.: 16/461,195

(22) PCT Filed: Nov. 25, 2016

(86) PCT No.: PCT/EP2016/078811
§ 371 (c)(1),
(2) Date: May 15, 2019

(87) PCT Pub. No.: WO2018/095534
PCT Pub. Date: May 31, 2018

(65) Prior Publication Data
US 2019/0310319 A1 Oct. 10, 2019

(51) Int. Cl.
*G01R 31/396* (2019.01)
*G01R 31/36* (2020.01)
(Continued)

(52) U.S. Cl.
CPC .......... *G01R 31/3648* (2013.01); *B60L 58/12* (2019.02); *G01R 31/374* (2019.01);
(Continued)

(58) Field of Classification Search
CPC .............. G01R 31/3648; G01R 31/396; G01R 31/3842; G01R 31/374; H01M 10/42;
(Continued)

(56) References Cited

U.S. PATENT DOCUMENTS 5,804,894 A * 9/1998 Leeson ............ G01R 19/16542 307/130
2010/0121511 A1 5/2010 Onnerud et al.
(Continued)

FOREIGN PATENT DOCUMENTS

CN 201673232 U 12/2010
CN 103064032 A 4/2013
(Continued)

OTHER PUBLICATIONS

International Search Report and Written Opinion dated Aug. 11, 2017 in International Application No. PCT/EP2016/078811.
(Continued)

*Primary Examiner* — Nghia M Doan
(74) *Attorney, Agent, or Firm* — Venable LLP; Jeffri A. Kaminski

(57) ABSTRACT

The present invention relates to a method and arrangement for classifying a voltage fault condition of a battery comprising a plurality of cells for a vehicle. The method comprises detecting a cell voltage of one of the cells (S1), determining that the cell has a voltage fault condition based on the cell voltage being outside a predetermined voltage range (S2), classifying the severity of the voltage fault condition based on the cell voltage (S3), performing at least one diagnostic test routine, based on the severity of the voltage fault condition, to provide a cause for the voltage fault condition (S4), selecting and adapting a battery operation condition, based on the severity of the voltage fault condition and the cause, such that the battery is enabled to continue to operate the vehicle (S5).

16 Claims, 4 Drawing Sheets

| Detection | Classification | Perform test and adapt A1 |
|---|---|---|
| 4.0V > | Breakdown | Dissconnect cell and apply further appropiate actions. Maybe stop on road. |
| 3.8 - 4.0V | High severity | Finding cause and applying action. |
| 3.6 - 3-8V | Medium severity | Finding cause and applying action. |
| 3.4 - 3.6V | Low severity | Finding cause and applying action. |
| 2.7 - 3.4V | Normal operating range | |
| 2.5 - 2.7V | Low severity | |
| 2.2 - 2.5V | Medium severity | |
| 2.0 - 2.2V | High severity | |
| 2.0V < | Breakdown | |

A2

(51) Int. Cl.

| | |
|---|---|
| ***G01R 31/3842*** | (2019.01) |
| ***G01R 31/374*** | (2019.01) |
| ***B60L 58/12*** | (2019.01) |
| ***H01M 10/48*** | (2006.01) |
| ***H01M 10/42*** | (2006.01) |

(52) U.S. Cl.

CPC ....... *G01R 31/3842* (2019.01); *G01R 31/396* (2019.01); *H01M 10/42* (2013.01); *H01M 10/482* (2013.01); *H01M 10/48* (2013.01); *H01M 2010/4271* (2013.01); *H01M 2010/4278* (2013.01); *H01M 2220/20* (2013.01)

(58) Field of Classification Search

CPC ............... H01M 10/482; H01M 10/48; H01M 2010/4271; H01M 2010/4278; H01M 2220/20; B60L 58/12; Y02E 60/10; Y02T 10/70

See application file for complete search history.

(56) References Cited

U.S. PATENT DOCUMENTS

| | | | | |
|---|---|---|---|---|
| 2010/0261048 | A1* | 10/2010 | Kim | B60L 58/21 429/150 |
| 2011/0089953 | A1* | 4/2011 | Chandler | H01M 10/425 324/427 |
| 2012/0274281 | A1* | 11/2012 | Kim | G01R 31/3835 320/112 |
| 2013/0127611 | A1 | 5/2013 | Bernstein et al. | |
| 2014/0225622 | A1* | 8/2014 | Kudo | B60L 50/66 324/433 |
| 2015/0070023 | A1 | 3/2015 | Kudo et al. | |
| 2015/0323609 | A1 | 11/2015 | Kudo et al. | |
| 2020/0091562 | A1* | 3/2020 | Mi | G01R 31/3648 |

FOREIGN PATENT DOCUMENTS

| | | | |
|---|---|---|---|
| CN | 103312009 | B | 4/2015 |
| CN | 104833926 | A | 8/2015 |
| CN | 105514526 | A | 4/2016 |
| CN | 105691226 | A | 6/2016 |
| CN | 105857109 | A | 8/2016 |
| CN | 105955160 | A | 9/2016 |
| EP | 2337182 | A2 | 6/2011 |
| EP | 2485293 | A1 | 8/2012 |
| JP | 2006109540 | A | 4/2006 |
| JP | 2015001439 | A | 1/2015 |
| WO | 2016009175 | A1 | 1/2016 |
| WO | 2016198103 | A1 | 12/2016 |

OTHER PUBLICATIONS

China Office Action dated Feb. 2, 2021 in corresponding China Patent Application No. 201680090908.3, 21 pages.

China Office Action dated Aug. 3, 2021 in corresponding China Patent Application No. 201680090908.3, 21 pages.

* cited by examiner

METHOD AND ARRANGMENT FOR CLASSIFYING A VOLTAGE FAULT CONDITION IN AN ELECTRICAL STORAGE SYSTEM

TECHNICAL FIELD

The present invention relates to method and arrangement for classifying a voltage fault condition in a battery for a hybrid vehicle or electric vehicle. The invention also relates to a vehicle comprising such an arrangement.

BACKGROUND

In the field of vehicles, there is an increase in research and development related to propulsion of vehicles with alternative power sources, i.e. power sources being used as alternatives to conventional internal combustion engines.

An internal combustion engine, for example in the form of a gasoline engine or a diesel engine, offers high efficiency with relatively low fuel consumption. However, environmental concerns have caused an increase in development of more environmental-friendly power sources for vehicles. In particular, the development of electrically operated vehicles has emerged as a promising alternative.

There exist various types of vehicle propulsion systems comprising electric machines. For example, a vehicle can be operated by means of an electric machine solely, or by means of an arrangement comprising both an electric machine and an internal combustion engine. The latter alternative is often referred to as a hybrid vehicle (HEV), and can for example be utilized in a manner in which an internal combustion engine is used for operating the vehicle while driving outside urban areas whereas the electric machine can be used in urban areas or in environments in which there is a need to limit the discharge of harmful pollutants such as carbon monoxide and oxides of nitrogen. According to known technology, electric machines are operated by means of a storage system for electrical energy arranged in the vehicle, typically in the form of one or a plurality of battery unit(s) which is formed by a plurality of rechargeable battery cells and an associated control unit.

In the context of this disclosure, the term “electrically operated vehicles” refers both to pure electric vehicles and to hybrid electric vehicles. Some hybrid electric vehicles may be referred to as plug-in hybrid electric vehicle. A plug-in hybrid electric vehicle uses an energy storage system with rechargeable batteries or another suitable energy source which can be restored into a condition involving a full charge through a connection to an external electric power supply, and may also be driven by e.g. a internal combustion engine to recharge the batteries.

The technology involved in electrically operated vehicles is closely related to the development of chargeable batteries. Today, lithium-ion batteries are considered as the most appropriate battery technology for range, power, and recharging time.

When an electrically operated vehicle is operated, the battery need to be continuously monitored to avoid a breakdown of cells in the battery pack. This allows a battery controller to stop charge and discharge from a battery pack to protect the battery pack. Thereby, downtime and expensive maintenance or even replacement of the battery unit or a cell therein may be avoided, for example by automatically stopping the operation of the vehicle when the parameters of the battery unit indicate an error.

An exemplary system for protecting an energy storage system is disclosed in US patent application no. 2010/0121511, where the a module management electronics may place battery modules in protective modes based upon the performance of each module, or battery cell therein, based on comparison to known or configurable specifications of the battery. For example, if the module management electronics detect a too high or low temperature in a battery module, the battery module may be placed in a permanent shutdown protective mode for later replacement. Further, the main controller of the battery array may determine the state of health (SOH) of the battery modules by looking at several parameters of the battery module. When the SOH of a battery module drops below a threshold SOH, the main controller may alert the user that the battery modules are in need of servicing.

However, the solution disclosed in in US patent application no. 2010/0121511 suffers from a number of drawbacks such as reducing the number of available battery modules for operating the vehicle which may stop or hinder the user arriving at their intended destination or the operation of the vehicle altogether due to temperature issues or the like.

Hence, there is a desire to provide an improved system or method for protecting battery modules or cells while improving the uptime of the battery pack.

SUMMARY

It is an object of the present invention to improve the current state of the art, to at least partly alleviate the above problems, and to provide an improved arrangement and method for classifying voltage fault condition in a battery.

According to a first aspect of the invention, these and other objectives are at least partly met by a method for classifying a voltage fault condition of a battery comprising a plurality of cells for a vehicle, the method comprises:

- detecting a cell voltage of one of the cells;
- determining that the cell has a voltage fault condition based on the cell voltage being outside a predetermined voltage range;
- classifying the severity of the voltage fault condition based on the cell voltage;
- performing at least one diagnostic test routine, based on the severity of the voltage fault condition, to provide a cause for the voltage fault condition;
- selecting and adapting a battery operation condition, based on the severity of the voltage fault condition and the cause, such that the battery is enabled to continue to operate the vehicle.

According to a second aspect of the invention, these and other objectives are at least partly met by an arrangement for classifying a voltage fault condition of a battery comprising a plurality of cells for a vehicle, the arrangement comprises:

- a sensor arranged to detect a cell voltage of at least one of the cells; and
- a control unit configured to determine that the cell has a voltage fault condition based on the cell voltage being outside a predetermined voltage range, and classify the severity of the voltage fault condition based on the cell voltage;
- the control unit is further configured to perform at least one diagnostic test routine to provide a cause for the voltage fault condition and adapt a battery operation condition, based on the severity of the voltage fault condition and the cause, such that the battery is enabled to continue to operate the vehicle.

The present invention is based on the realization that the cell voltage of the cells of a battery may end up outside a predetermined voltage range due to several causes which need not be directly dangerous or damaging to the battery. Hence, permanently suspending operation of the battery pack or cell in question may not be necessary. By classifying the severity of the voltage fault condition based on the cell voltage, the invention provides a quicker way identify the apparent cause of the voltage fault condition by performing at least one diagnostic test routine, based on the severity of the voltage fault condition. Thereby, a correct battery operation condition may be selected and adapted, based on the severity of the voltage fault condition and the cause, such that the battery is enabled to continue to operate the vehicle. The expression selecting and adapting a battery operation condition should be understood to comprise taking an action which reduces the severity, or eliminates the cause of the voltage fault condition. Hence, the present invention provides an improved manner of identifying the relevant cause, or causes, behind a voltage fault condition. Thereby, the cause may be identified with less operations and tests which are time and/or energy consuming.

A predetermined voltage range for the cell may be e.g. a voltage range of 1V to 10V. Alternatively, a predetermined voltage range for the cell may be e.g. a voltage range of 1.0V to 5.0V, or 2.7V to 3.4V, or 2.7V to 4.0V. Hence, a voltage outside such a range may be utilized to determine that a voltage fault condition is present. The voltage range may depend on the chemistry of the cell, and also the power window and energy window that is required. Both the power window (i.e. the SOC window where the power requirement are met) and the energy window may influence the voltage range and thus the trigger conditions for a voltage fault condition. It should thus be understood that the present invention may be used to advantage with a wide range of batteries and battery cell chemistries.

In at least one exemplary embodiment, the method further comprises repeating the steps of the method for a portion of the cells of a battery. Stated differently, the method is repeatedly performed for a portion of the cells of the battery, or for all the cells of the battery in order to classify the voltage fault condition of the whole battery.

In at least one exemplary embodiment, the method further comprises increasing the severity of the voltage fault condition based on historical data. For example, the severity may be increased if a voltage fault condition has occurred previously for the cell. This means that a less serious voltage fault condition may be classified as more severe if a voltage fault condition has occurred more than once. Thereby, more severe cause(s) and reason(s) behind the voltage fault condition may be identified even if the severity of the voltage fault condition is low. In another example, the severity may be decreased if no voltage fault condition has occurred previously. The expression historical data should be interpreted as data based on the previous performance of the battery and/or cells such as voltage fault conditions, or data based on previous performance of a battery and/or cells which are of similar make and/or type and installed in a similar vehicle. The data may be stored in a control unit, or may be retrieved using a wired or wireless network from a remote database.

In at least one exemplary embodiment, the step of classifying the severity of the voltage fault condition further comprises classifying the voltage fault condition to be of low severity, medium severity, high severity or breakdown severity. A low severity should be understood to mean that selecting and adapting a battery operation condition comprises adapting the battery itself, whereas for the medium severity, high severity and breakdown severity comprise adapting control parameters for the vehicle and vehicle control unit(s) in order to reduce the severity of the voltage fault condition. Stated differently, a certain cause leading to a voltage fault condition may be classified differently based on information relating to the vehicles previous action. Further, it is not always the battery control unit which measures and controls the power output from the battery. Hence, even if the battery control unit has sent information relating to a predetermined limit of power usage, the vehicle control unit may exceed this limit due to actions of e.g. the driver which causes the voltage to exceed the predetermined threshold. An adapted control parameter can thus introduce a "hard" limit to the vehicle control unit which is not allowed to be exceeded. This means that the exceeded power usage may be an isolated incident, and the corresponding voltage fault condition be classified at a lower severity based on data from the vehicle control unit(s). Thereby, it should also be understood that if the data received from the vehicle control unit(s) indicated that the power usage has not been exceeded; the voltage fault condition severity is classified based on the cell voltage.

In at least one exemplary embodiment, the step of selecting and adapting a battery operation condition further comprises transmitting an adapted control parameter to the vehicle control unit. The control parameter may comprise information relating to at least one of: maximum allowable power withdrawal or maximum allowable energy withdrawal if a lower voltage threshold has been exceeded, alternatively a maximum allowable charge power or maximum allowable charged energy if an upper voltage threshold has been exceeded, and a highest or lowest allowable temperature for usage.

In at least one exemplary embodiment, the at least one diagnostic test routine comprises measuring the cell temperature and determining whether the cell temperature is outside a predetermined cell temperature working range. The predetermined cell temperature range may be −30 to 90 degrees centigrade, or −10 to 60 degrees centigrade. The cells of the battery may degrade, in particular the state of power of the battery, and the cell, may become degraded due to being subjected by a temperature outside of the predetermined cell temperature working range for an extended period of time. Further, this may of course indicated a malfunction in a heating/cooling system for the battery. A cell temperature outside the predetermined cell temperature working range is of medium severity.

In at least one exemplary embodiment, selecting and adapting a battery operation condition comprises heating or cooling the cell. Devices and arrangements for heating and cooling a battery, and cells therein, are known in the art, for example fans, or cooling channels having a heating/cooling medium therein being led or pumped in thermal connection with the cell in question. Hence, any such heating or cooling method or structure may be used to advantage with the present invention. By bringing the cell temperature into the predetermined cell temperature working range by operating a cooling or heating device, the cause of voltage fault condition is counteracted.

In at least one exemplary embodiment, the at least one diagnostic test routine comprises determining whether a current or power withdrawn or applied from or to the cell exceeds a predetermined current or power threshold. The determination may be made for momentaneous withdrawal of current or power, or over a predetermined period of time such as a driving cycle, hours, minutes, or seconds. Stated differently, by determining whether current or power withdrawn from the cell exceeds a predetermined amount instantaneously or over a period of time the cause for the voltage fault condition is determined as current or power overshoot. Hence, a power pulse provided from the battery to the vehicle which exceeds the predetermined parameters is detrimental to the battery. A current or power overshoot may be of medium severity. A current or power overshoot may be of high severity depending on the amplitude and duration of the current or power overshoot.

In at least one exemplary embodiment, the at least one diagnostic test routine comprises determining whether the cell is unbalanced compared to the rest of the cells of the battery. The determination that the cell is unbalanced with regard to the rest of the cells of the battery may be based on the voltage level at which the balancing determination was made, or the time since last balancing period, or the degree of completion of the last balancing period, and the amount of current through cell the since last balancing period. Stated differently, the determination that the cell is unbalanced with regard to the rest of the cells of the battery may not simply comprising determining a state-of-balance, SOB, but also other factors involved in balancing. An unbalanced cell may be of low severity.

In at least one exemplary embodiment, the at least one diagnostic test routine comprises determining whether the state of charge, SOC, of the cell is inaccurate. The determination that the SOC of the cell is inaccurate may be based on based on the voltage level at which the previous SOC determination from open circuit voltage (OCV) was made, temperature at which the previous SOC determination from OCV was made, amount of current through cell since the last OCV determination, and an inaccuracy of a current sensor. Alternatively or additionally, an inaccurate SOC may also be detected and determined based on the voltage of the cell reaching either a high or low voltage under load. A high or low voltage should hereby be understood as a voltage outside a predetermined voltage range for the cell. An inaccurate SOC of the cell may be of low severity.

In at least one exemplary embodiment, the at least one diagnostic test routine comprises determining whether the cell has failed. The determination whether the cell has failed may be based on the cell reaching both a cell voltage above and below the predetermined voltage range under load, or that the cell that reaches has the lowest voltage under load also has the lowest voltage under no load, or that the cell having the highest voltage under load also has the highest voltage under no load. Alternatively, the determination whether the cell has failed may be based whether a cell has a resistance higher than a failure threshold, or whether the capacity and/or the resistance of the cell differentiates from the rest of the cells of the battery. A threshold difference in capacity between the cell and the rest of the cell of the battery may be a capacity which is 10% lower than a mean or median value of the capacity of the cells of the battery. The failure threshold of resistance will be floating over life and it will be relative to what it should be at the given time and the actual threshold is in voltage, 2.2 and 4.0V, at a power (current) that should have been possible at that age based on historical or known data. A cell failure may be of breakdown severity.

In at least one exemplary embodiment, the at least one diagnostic test routine comprises determining whether the state-of-health, SOH, of the cell is inaccurate. Hence, if none of the other diagnostic test routines returned a cause for voltage fault condition the SOH of the cell is deemed inaccurate and is therefore lowered to take into account the lower SOH for future use of the cell. Additionally, determining the SOH of the cell is inaccurate may comprise performing the method for a plurality of cells, such as 5, 10, 15, 20 or more cell, and determining that the SOH is inaccurate based on the result of no cause being determined for a voltage fault condition for the plurality of cells. For example, in order to reduce the likelihood that voltage fault condition occurs for a cell with an inaccurate SOH, the power usage and settings for ageing may be adapted. Power usage and settings for ageing should be interpreted as limiting the power able to be withdrawn from the cell, and reducing the available total capacity from the cell in a battery control unit. Further, in one exemplary embodiment the battery control unit may transmit data regarding the power usage and setting to a vehicle control unit in order to limit the power withdrawal requirements from the vehicle control unit. An inaccurate SOH of the cell may be of low severity.

In at least one exemplary embodiment, the at least one diagnostic test routine comprises determining whether disturbances on the traction voltage are present. Disturbances on the traction voltage may be from a component with intermittent isolation problems (to ground), or intermittent short circuit pole-pole causing EMC behavior outside the specified traction voltage. Alternatively, components may be going on/off and causing the behavior on the traction voltage not to be according to expectation. Disturbances on the traction voltage may be of medium severity.

In at least one exemplary embodiment, selecting and adapting a battery operation comprises at least one of the following: changing a parameter in a control algorithm, charging the cell, discharging the cell, balancing the electrical storage system, or performing a SOH calibration. Changing a parameter in a control algorithm may comprise adapting the maximum state-of-power (SOP) from the battery pack in the control unit, or adapting the state-of-charge (SOC) window such that a cell voltage fault condition is less likely to occur. Stated differently, the allowable high and low limit of SOC for the cell may be decreased such that the SOC window is moved or narrowed. Further, selecting and adapting a battery operation may comprise adapting a temperature control parameter as disclosed in the International Patent Application PCT/EP2015/062946 by the same inventors to increase the available power at the end-of-life of the battery and/or cell, the reference is hereby incorporated in entirety. Further, in one exemplary embodiment the battery control unit may transmit data regarding the power usage and setting to a vehicle control unit in order to limit the power withdrawal requirements from the vehicle control unit.

In at least one exemplary embodiment, the method further comprises the step of transmitting the detected cell voltage, the at least one diagnostic test, the severity, the cause and the battery operation selected or adapted. The detected cell voltage, the at least one diagnostic test, the severity, the cause and the battery operation selected or adapted may be sent to a remote database via a wired or wireless connection such that the historical data of the cause and other parameter may be provided to other arrangements and/or vehicles utilizing the inventive concept.

According to a further aspect of the invention, the invention may also be embodied by a computer program product comprising computer program code. Which computer program code is configured to perform the steps of the method according to any of the previous described exemplary embodiments when executed by a processor.

According to a further aspect of the invention, a vehicle comprising an arrangement for classifying a voltage fault condition of a battery comprising a plurality of cells for a vehicle in accordance with the second aspect is also part of the general inventive concept. The vehicle may be a commercial vehicle such as a truck, bus, or work machine. Alternatively, the vehicle may be an automobile.

Further features of, and advantages with, the present invention will become apparent when studying the appended claims and the following description. The skilled addressee realize that different features of the present invention may be combined to create embodiments other than those described in the following, without departing from the scope of the present invention.

BRIEF DESCRIPTION OF THE DRAWINGS

The various aspects of the invention, including its particular features and advantages, will be readily understood from the following detailed description and the accompanying drawings, in which.

DETAILED DESCRIPTION OF EXAMPLE EMBODIMENTS OF THE INVENTION

Figure 1:
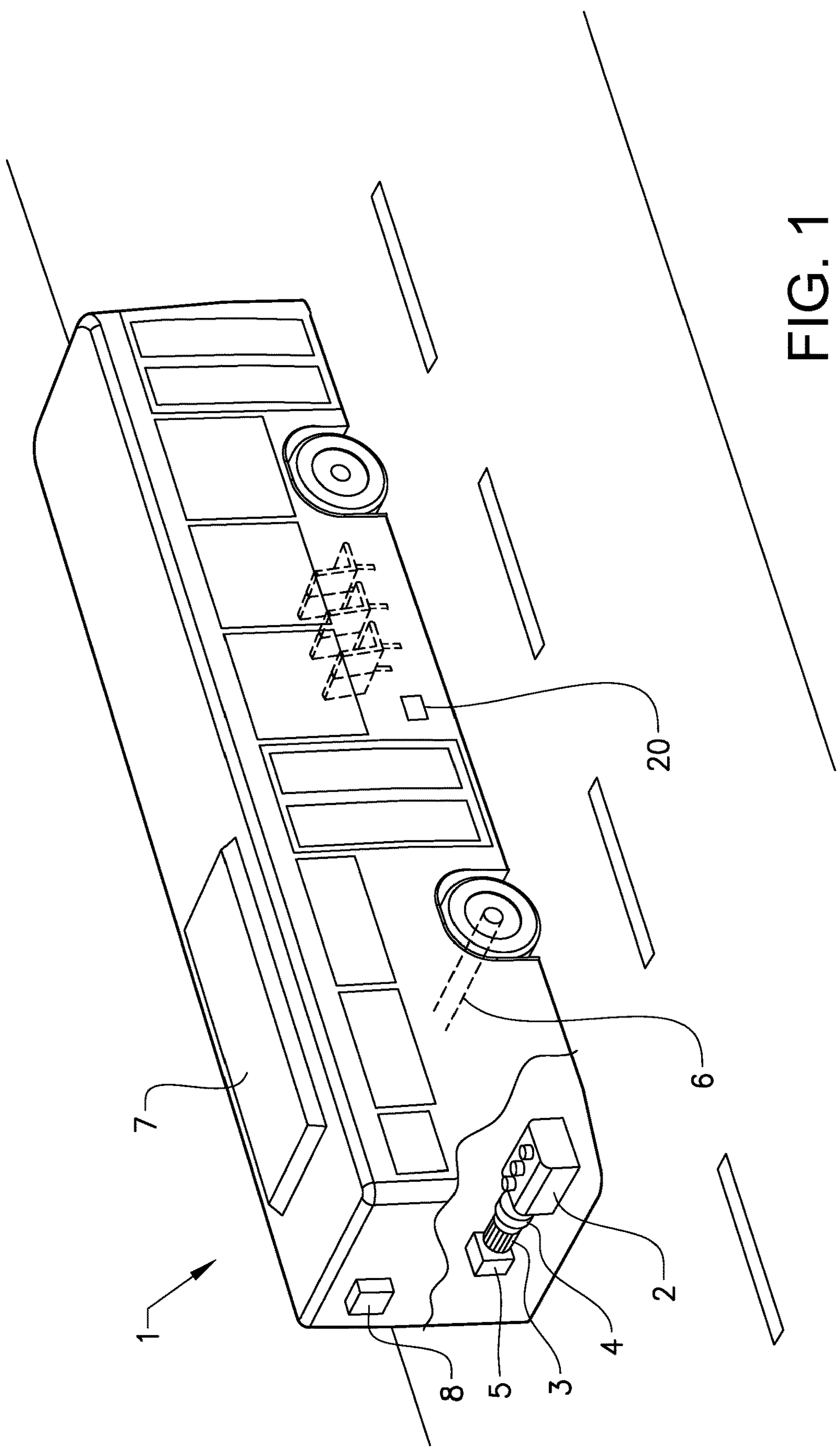
FIG. 1 shows a schematic view of a hybrid vehicle in the form of a bus, in which the present invention can be used.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled addressee. Like reference characters refer to like elements throughout.

With initial reference to FIG. 1, there is shown a simplified perspective view of a vehicle in the form of a bus 1. The bus 1 is of the so-called plug-in hybrid type and is equipped with an internal combustion engine 2 and an electric machine 3 which are connected to each other via a clutch 4. Both the internal combustion engine 2 and the electrical machine 3 can be used to drive the bus 1. The electric machine 3 is connected to a gearbox 5, which in turn is connected to a driven axle 6 of the bus 1, in this case the rear axle. However, in principle both axles or either axle, or the front axle may be the driven axle. In a manner which is known as such and therefore not described in detail, the internal combustion engine 2 and the electric machine 3 can be used for driving the axle 6. According to the embodiment, the electric machine 3 is used as a combined electric drive motor and generator, and is suitably also used as a starter motor for the internal combustion engine 2. However, the electric machine 3 may equally well be separate from a generator and/or starter motor for the internal combustion engine 2.

The bus 1 carries an electric energy storage system 7 which comprises a battery pack 7*a* which in turn comprises a plurality of battery cells (not shown in detail in FIG. 1). The battery cells are connected in series to provide an output DC voltage having a desired voltage level. Suitably, the battery cells are of lithium-ion type, but other types may in principle also be used.

The energy storage system 7 also comprises a sensor unit 7*b* which is arranged for measuring one or more predetermined parameters which are indicative of the state of operation of the battery pack 7*a*. The sensor unit 7*b* may be configured for measuring the voltage of the battery pack 7*a* and each individual battery cell. Furthermore, the sensor unit 7*b* may be configured for measuring an alternative parameter, such as the battery current and the temperature of the battery pack 7*a* and each individual battery cell. Also, the sensor unit 7*b* can be used for measuring further signals which are related to the status of the performance, in terms of its power, capacity or other suitable parameters, of the battery pack 7*a* and each individual battery cell. As will be described in detail below, the parameter or parameters measured by means of the sensor unit 7*b* can be utilized in further processes.

In the embodiment shown in FIG. 1, the energy storage system 7 is arranged on the roof of the bus 1. However, the energy storage system 7 may be arranged anywhere suitable in the vehicle. In particular, the energy storage system 7 may often be arranged in the lower portions of the vehicle 1 such that the center of mass is lower. The above-mentioned components of the propulsion system of the bus 1, including the energy storage system 7, are connected to a vehicle control unit 20.

Even though this disclosure refers to a battery pack 7*a* used in a vehicle 1 in the form of a bus, it can be applied in virtually any type of vehicle which has an energy storage system comprising a battery pack with a number of battery cells. For example, the invention can be applied in hybrid electric vehicles (HEV), full electric vehicles (FEV), battery electric vehicles (BEV), plug-in hybrid vehicles (PHEV) and other forms of vehicles using batteries. The invention may be used in a truck or a construction equipment machine. The invention can also be used in marine vessels and applications involving power plants and other situations in which battery packs of the above-mentioned type are used.

During certain modes of operation of the bus 1, it is suitable to use the electric machine 3 for operating the bus 1. This means that the energy storage system 7 will deliver power to the electric machine 3, which in turn is driving the rear axle 6. The manner in which an electric machine and an internal combustion engine can be combined and used for operating a vehicle is generally previously known and for this reason, it is not described in any greater detail here.

The bus 1 is equipped with a first electric connector element 9, for example in the form of a plug or pantograph. The first electric connector element 9 is arranged to be connected to a second electric connector element 10, for example in the form of an external electrical plug or an overhead electrical conductor wire, or any other form of an external electrical connector. The external connector 10 is connected to an external electrical power supply 11, and may thus charge the energy storage system 7 when connected. Hence, the present invention is also suitable to use in a HEV, FEV, and BEV where the vehicle may operate without contact with an external power supply 11 during operation.

The bus 1 also comprises a vehicle control unit 20. The vehicle control unit 20 comprises electronic circuits and connections (not shown) as well as processing circuitry (not shown) such that the vehicle control unit 20 can communicate with different parts of the bus 1 such as the brakes, suspension, driveline, in particular the internal combustion engine 2, the electric machine 3, the clutch 4, and the gearbox 5 in order to operate the bus 1. The vehicle control unit 20 may comprise modules in either hardware or software, or partially in hardware or software and communicate using known transmission buses such as CAN-bus. The processing circuitry may be a general purpose processor or a specific processor. The vehicle control unit 20 comprises a non-transistory memory for storing computer program code and data upon. Thus, the skilled addressee realizes that the vehicle control unit 20 may be embodied by many different constructions. The vehicle control unit 20 is connected to the battery control unit 8 of the battery for transmitting and receiving information, such as power requests as a result of the driver of the vehicle 1 operating the vehicle 1.

Figure 2:
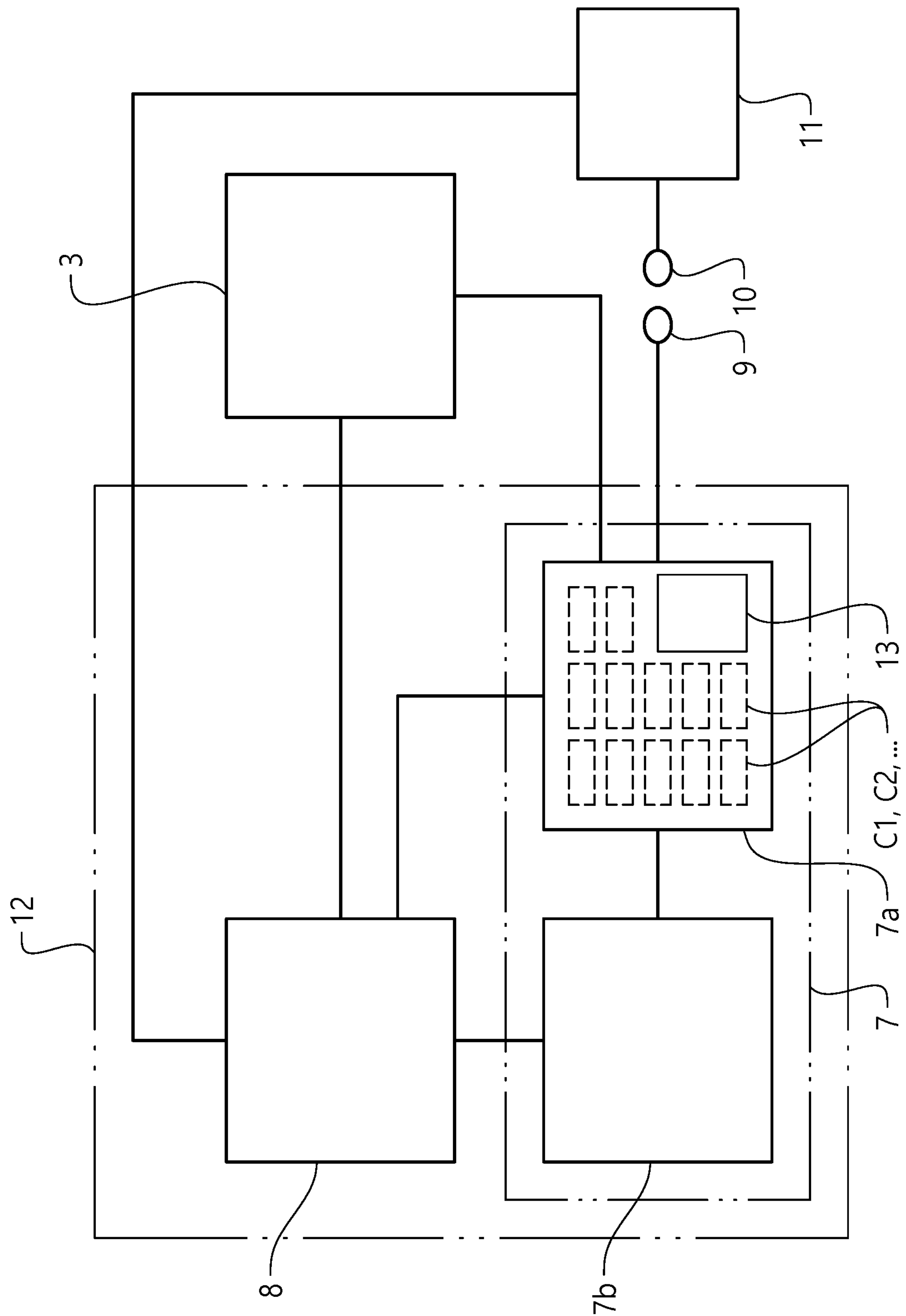
FIG. 2 is a schematic view of an energy storage management system for a vehicle, in accordance with embodiment of the invention.

FIG. 2 is a simplified schedule of the battery pack 7*a* and associated components of the vehicle 1. The battery pack 7*a* comprises a number of battery cells C1, C2, C3, . . . etc. (also referred to with reference "C"). Typically the number of battery cells is in the range of 90 to 400 cells, although the specific number may vary. The battery cells are of the lithium ion type, although the principles of the invention are equally applicable to other types of battery cells.

The battery pack 7*a* is connected to the electric machine 3 and is configured for operating the electric machine 3 (which in turn operates the vehicle 1). Furthermore, the battery pack 7*a* is connected to the sensor unit 7*b*, which in turn is connected to a battery control unit 8.

The sensor unit 7*b* may be configured for measuring the voltage, temperature or other parameters of the battery pack 7*a*. Consequently, the sensor unit 7*b* is configured for measuring the terminal voltage U for each battery cell C and for transmitting information related to the measured voltage values to the battery control unit 8. As mentioned above, the sensor unit 7*b* may be configured to measure further parameters, such as the current and the temperature each individual battery cell C1, C2, C3 . . . etc. Also, the sensor unit 7*b* may be used for measuring further signals which are related to the status of the performance, in terms of its power, capacity or other suitable parameters, of each individual battery cell of the battery 7*a*.

Turning to the present invention, an arrangement for classifying a voltage fault condition of the battery pack 7*a* comprises the sensor unit 7*b* arranged to detect a cell voltage of one of the cells C and the battery control unit 8. In the inventive concept the battery control unit 8 is configured to determine that a cell C, e.g. one of the cells has a voltage fault condition based on the cell voltage being outside a predetermined voltage range. A predetermined voltage range for the cell may be e.g. a voltage range of 1V to 10V. Alternatively, a predetermined voltage range for the cell may be e.g. a voltage range of 1.0V to 5.0V, or 2.7V to 3.4V, or 2.7V to 4.0V. Hence, a voltage outside such a range may be utilized to determine that a voltage fault condition is present. The voltage range may depend on the chemistry of the cell, and also the power window and energy window that is required. Both the power window and the energy window may influence the voltage range and thus the trigger conditions for a voltage fault condition. It should thus be understood that the present invention may be used to advantage with a wide range of batteries and battery cell chemistries.

The battery control unit 8 is further configured to classify the severity of the voltage fault condition based on the cell voltage. Stated differently, the battery control unit 8 classifies the severity of the voltage fault condition based on the magnitude of the measured cell voltage.

The control unit 8 is further configured to perform at least one diagnostic test routine to provide a cause for the voltage fault condition. Hereby, one advantage with the inventive concept should be understood, as the battery control unit 8 starts to perform diagnostic test routines for causes which are likely to correspond to the measured severity of the voltage fault condition, the battery control unit 8 is likely to find that cause or causes in a quicker manner that simply randomly testing causes for voltage fault conditions.

The battery control unit 8 is further configured to select and adapt a battery operation condition, based on the severity of the voltage fault condition, such that the battery is enabled to continue to operate the vehicle.

A diagnostic test routine should be in the context of this application be construed as a test to identify and verify the cause(s) and reason(s) which lead to the voltage fault condition. This will be further exemplified in the following in conjunction with FIGS. 3 and 4.

Further, the likely causes and diagnostic test routines explained in the following for the method should be understood to be applicable also for the battery control unit 8. In particular the battery control unit 8 may communicate with the vehicle control unit 20.

To classify the severity of the voltage fault condition may comprise classifying the voltage fault condition to be of low severity, medium severity, high severity or breakdown severity. A low severity should be understood to mean that selecting and adapting a battery operation condition comprises adapting the battery itself, whereas for the medium severity, high severity and breakdown severity comprise adapting control parameters for the vehicle via the vehicle control unit 20 in order to reduce the severity of the voltage fault condition. Stated differently, a certain cause leading to a voltage fault condition may be classified differently based on information relating to the vehicles previous action.

Further, it is not always the battery control unit 8 which measures and controls the power output from the battery 7. Hence, even if the battery control unit 8 has sent information relating to a predetermined limit of power usage, the vehicle control unit 20 may exceed this limit due to actions of e.g. the driver which causes the voltage to exceed the predetermined threshold. This means that the exceeded power usage may be an isolated incident, and the corresponding voltage fault condition be classified at a lower severity based on data from the vehicle control unit 20. Thereby, it should also be understood that if the data received from the vehicle control unit 20 indicates that the power usage has not been exceeded; the voltage fault condition severity is classified based on the cell voltage.

It should be understood that the functions of the battery control unit 8 may be best understood in the following description in relation to a method elucidated by the flowchart FIG. 3 and the graph in FIG. 4. However, it should of course be noted that the functionality of the battery control unit 8 may be embodied wholly in hardware or software, or partially in software and partially by hardware. The battery control unit 8 may comprise a general purpose processor, a non-transitory memory, and electronic circuits required for the battery control unit 8 to communicate with at least the sensor unit 7*b*, the battery pack 7*a*, and also electronic circuits to drive a processor and memory. Further, the battery control unit 8 may comprise electronic circuits required for communication wired or wirelessly with an external database, such as a remote server and the vehicle control unit 20. Hence, it is understood that portions of the functionality may be embodied by software modules stored on a non-transistory memory, or by hardware modules (not shown) comprised in the battery control unit 8.

Figure 3:
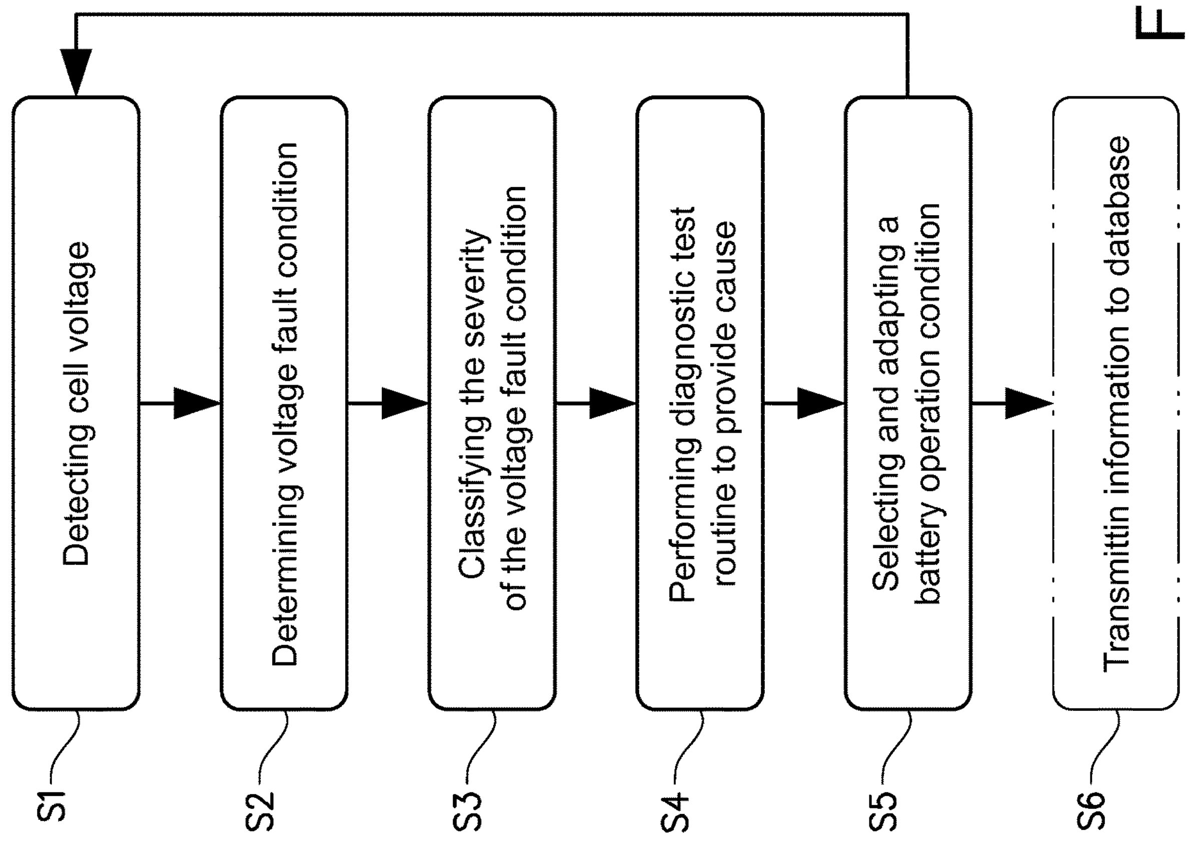
FIG. 3 is a flowchart which illustrates a method for classifying voltage fault condition in a battery according to at least one embodiment of the invention.

FIG. 3 is a flowchart which illustrates a method for classifying voltage fault condition in a battery according to at least one embodiment of the invention. The method may for example be carried out using the components and systems illustrated and described in conjunction with FIGS. 1 and 2.

The method comprises a first step, S1, of detecting a cell voltage of one of the cells C. The cell voltage may be detected for example via the sensor unit 7*b* shown in FIG. 2.

The method comprises a further step, S2, of determining that the cell has a voltage fault condition based on the cell voltage being outside a predetermined voltage range. A predetermined voltage range for the cell may be e.g. a voltage range of 2.7 to 4.0 V.

Hence, by comparing the measured cell voltage U with the predetermined voltage range, a determination can be made that a voltage fault condition is present. The control unit 8 may make the comparison between the measured cell voltage U and the predetermined voltage range.

It should of course be noted that if no voltage fault condition is present, i.e. the cell voltage is within the predetermined voltage range, the method typically continues to measure another cell of the battery. It is of course also possible that the method is performed in parallel simultaneously for a portion of the cells of the battery or for all the cells of the battery.

The method comprises a further step, S3, of classifying the severity of the voltage fault condition based on the cell voltage. In other words, the severity is dependent on the magnitude of the voltage fault condition. Hence, a measured voltage having a higher deviation from the predetermined voltage range may directly lead to a higher severity being classified while a measured voltage having a lower deviation from the predetermined voltage range may lead to a lower severity.

Step S3 may further comprises increasing the severity of the voltage fault condition based on historical data. For example, the severity may be increased if a voltage fault condition has occurred previously for the cell. This means that a less serious voltage fault condition may be classified as more severe if a voltage fault condition has occurred more than once. Thereby, more severe cause(s) and reason(s) behind the voltage fault condition may be identified even if the severity of the voltage fault condition is low. The expression historical data should be interpreted as data based on the previous performance of the battery and/or cells such as voltage fault conditions, or data based on previous performance of a battery and/or cells which are of similar make and/or type and installed in a similar vehicle. The data may be stored in a control unit, or may be retrieved using a wired or wireless network from a remote database.

Step S3 may further comprises classifying the voltage fault condition to be of low severity, medium severity, high severity or breakdown severity. A low severity should be understood to mean that, later in the method, selecting and adapting a battery operation condition comprises adapting the battery itself, whereas for the medium severity, high severity and breakdown severity comprise adapting control parameters for the vehicle and vehicle control unit(s) in order to reduce the severity of the voltage fault condition. Stated differently, a certain cause leading to a voltage fault condition may be classified differently based on information relating to the vehicles previous action. Further, it is not always the battery control unit which measures and controls the power output from the battery. Hence, even if the battery control unit has sent information relating to a predetermined limit of power usage, the vehicle control unit may exceed this limit due to actions of e.g. the driver which causes the voltage to exceed the predetermined threshold. An adapted control parameter can thus introduce a "hard" limit to the vehicle control unit which is not allowed to be exceeded. This means that the exceeded power usage may be an isolated incident, and the corresponding voltage fault condition be classified at a lower severity based on data from the vehicle control unit(s). Thereby, it should also be understood that if the data received from the vehicle control unit(s) indicated that the power usage has not been exceeded; the voltage fault condition severity is classified based on the cell voltage. Exemplary ranges for the severity level(s) are exemplified in FIG. 4.

The method comprises a further step, S4, of performing at least one diagnostic test routine to provide a cause for the voltage fault condition. Exemplary diagnostic test routines to detect specific cause(s) will be explained in the following. However, the skilled addressee realizes that the inventive concept encompasses also suitable tests not explicitly noted, and may in principle use any test which is capable of identifying and providing a cause for the voltage fault condition.

The method comprises a further step, S5, of selecting and adapting a battery operation condition, based on the severity of the voltage fault condition and the cause, such that the battery is enabled to continue to operate the vehicle. Exemplary battery operation conditions will be exemplified in conjunction with FIG. 4.

In some exemplary embodiments, the step S5 comprises at least one of the following: changing a parameter in a control algorithm, charging the cell, discharging the cell, balancing the electrical storage system, or performing a SOH calibration. Changing a parameter in a control algorithm may comprise adapting the maximum state-of-power (SOP) from the battery pack in the control unit, or adapting the state-of-charge (SOC) window such that a cell voltage fault condition is less likely to occur. Stated differently, the allowable high and low limit of SOC for the cell may be decreased such that the SOC window is moved or narrowed. Further, selecting and adapting a battery operation may comprise adapting a temperature control parameter as disclosed in the International Patent Application PCT/EP2015/062946 by the same inventors to increase the available power at the end-of-life of the battery and/or cell, the reference is hereby incorporated in entirety. Further, in one exemplary embodiment the battery control unit may transmit data regarding the power usage and setting to a vehicle control unit in order to limit the power withdrawal requirements from the vehicle control unit.

In at least one exemplary embodiment, the step S5 may further comprise transmitting adapted control parameter to the vehicle control unit. The control parameter may comprise information relating to at least one of: maximum allowable power withdrawal, maximum allowable energy withdrawal.

The method may further comprise repeating the steps of the method, as indicated by the arrow from S5 to S1, for a portion of the cells of a battery, or for all the cells of the battery. Stated differently, the method is repeatedly performed for a portion of the cells of the battery, or for all the cells of the battery in order to classify the voltage fault condition of the whole battery.

In an alternative embodiment the method may optionally further comprise a step S6 of transmitting the detected cell voltage, the at least one diagnostic test, the severity, the cause and the battery operation selected or adapted. The detected cell voltage, the at least one diagnostic test, the severity, the cause and the battery operation selected or adapted may be sent to a remote database via a wired or wireless connection such that the historical data of the cause and other parameter may be provided to other arrangements and/or vehicles utilizing the inventive concept.

Figure 4:
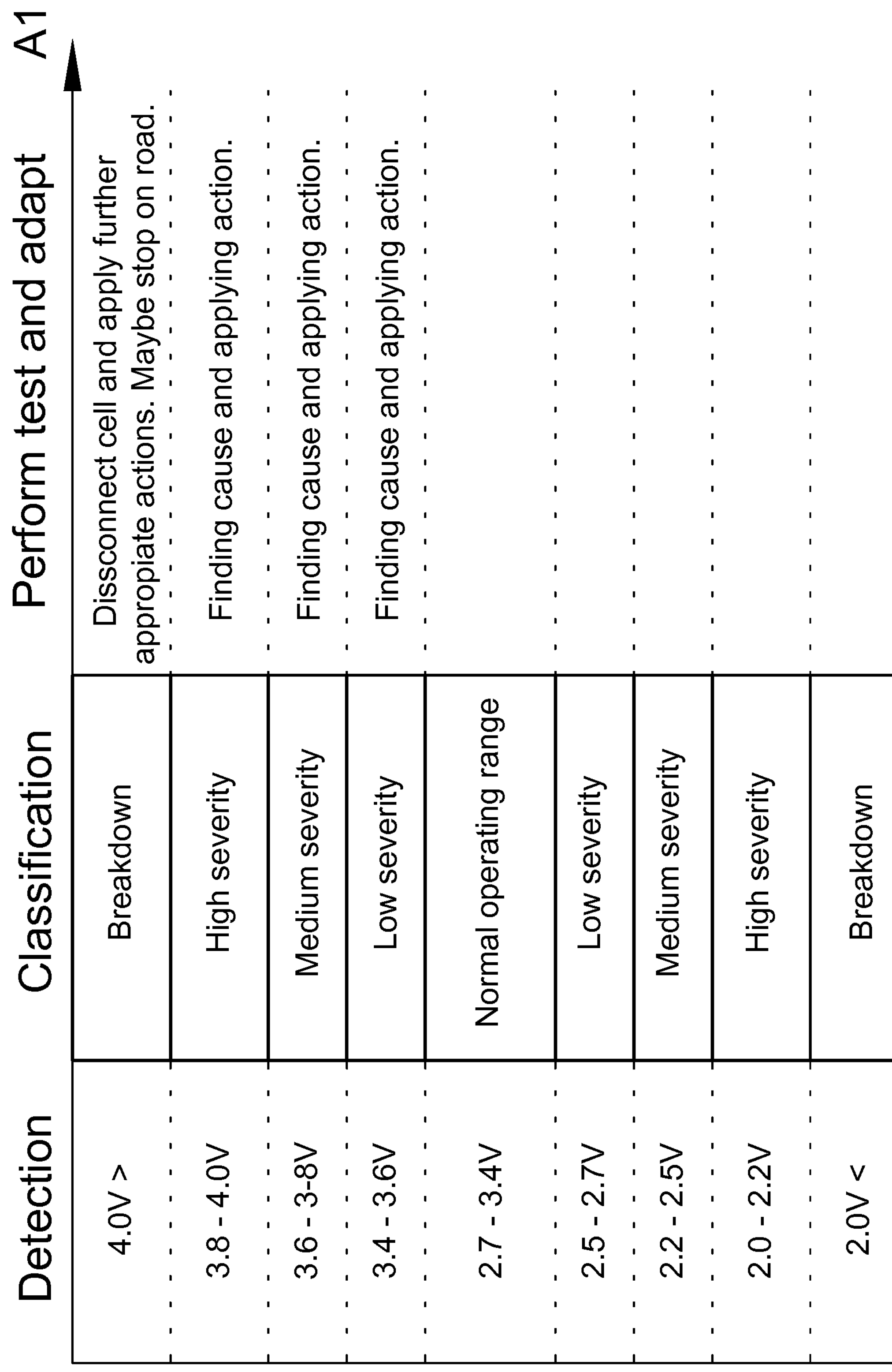
FIG. 4 is an exemplary graph illustrating the operation of a method for classifying voltage fault condition in a battery according to at least one embodiment of the invention

FIG. 4 is a graph showing the normal operating regions of the cell voltage as well as regions outside the normal operating range. Hence, the areas outside the normal operating region are examples of voltage fault conditions. For the sake of brevity, the text under "Perform test and adapt" is only noted on the voltage levels above the predetermined voltage range and not on the levels below the predetermined voltage range, the same of course applies to these levels as the levels of corresponding severity. As mentioned above, the predetermined voltage range may be 2.7V to 3.4V, but may also differ for different types of batteries and applications etc. Outside the normal operating range, both below and above the normal operating range, regions of voltage fault conditions are shown. The regions of voltage fault conditions closer to the normal operating range are regions of lower severity, with regard to the magnitude of the voltage fault condition without taking the cause into account. Hence, a voltage fault condition being detected in the exemplary ranges of 2.5V to 2.7V or 3.4V to 3.6V will be deemed to be off low severity. A voltage fault condition being detected in the exemplary ranges of 2.2V to 2.5V or 3.6V to 3.8V will be deemed to be off medium severity. A voltage fault condition being detected in the exemplary ranges of 2.0V to 2.2V or 3.8V to 4.0V will be deemed to be off high severity. It should of course be noted that a voltage fault condition outside those exemplary boundaries would cause a cell failure to be classified directly and the cell to be disconnected from the rest of the battery if possible, otherwise the control unit may cause the available power from the battery to be reduced to low level but still sufficient for the vehicle in which the invention is installed to safely stop or reach a service station. Alternatively, such a high voltage fault condition may trigger a direct shut-down of the battery for safety reasons.

The arrow A1 represents time during the operation of the method. Firstly, a detection of the cell voltage and a possible voltage fault condition is performed, for example according to the regions shown in FIG. 4, thereafter the voltage fault condition is classified, upon which the most likely cause will be investigated using at least one diagnostic test routine. When the cause(s) is/are found a battery operation condition is selected and adapted such that the battery is enabled to continue to operate the vehicle.

A low severity cause may be an unbalanced cell. Hence, the diagnostic test routine may comprise determining whether the cell is unbalanced compared to the rest of the cells of the battery. The determination that the cell is unbalanced with regard to the rest of the cells of the battery may be based on the voltage level at which the balancing determination was made, or the time since last balancing period, or the degree of completion of the last balancing period, and the amount of current through cell the since last balancing period. Stated differently, the determination that the cell is unbalanced with regard to the rest of the cells of the battery may not simply comprising determining a state-of-balance, SOB, but also other factors involved in balancing.

A low severity cause may be an inaccurate SOC of the cell. Hence, the diagnostic test routine may comprise determining whether the state of charge, SOC, of the cell is inaccurate. The determination that the SOC of the cell is inaccurate may be based on based on the voltage level at which the previous SOC determination from open circuit voltage (OCV) was made, temperature at which the previous SOC determination from OCV was made, amount of current through cell since the last OCV determination, and an inaccuracy of a current sensor. Alternatively or additionally, an inaccurate SOC may also be detected and determined based on the voltage of the cell reaching either a high or low voltage under load. A high or low voltage should hereby be understood as a voltage outside a predetermined voltage range for the cell.

A low severity cause may be an inaccurate SOH of the cell. Hence, the diagnostic test routine may comprise determining whether the state-of-health, SOH, of the cell is inaccurate. Hence, if none of the other diagnostic test routines returned a cause for voltage fault condition the SOH of the cell is deemed inaccurate and is therefore lowered to take into account the lower SOH for future use of the cell. Additionally, determining the SOH of the cell is inaccurate may comprise performing the method for a plurality of cells, such as 5, 10, 15, 20 or more cell, and determining that the SOH is inaccurate based on the result of no cause being determined for a voltage fault condition for the plurality of cells. For example, in order to reduce the likelihood that voltage fault condition occurs for a cell with an inaccurate SOH, the power usage and settings for ageing may be adapted. Power usage and settings for ageing should be interpreted as limiting the power able to be withdrawn from the cell, and reducing the available total capacity from the cell in a battery control unit. Further, in one exemplary embodiment the battery control unit may transmit data regarding the power usage and setting to a vehicle control unit in order to limit the power withdrawal requirements from the vehicle control unit.

A medium severity cause may be an abnormal temperature of the cell. Hence, the diagnostic test routine may comprise measuring the cell temperature and determining whether the cell temperature is outside a predetermined cell temperature working range. The predetermined cell temperature range may be −30 to 90 degrees centigrade, or −10 to 60 degrees centigrade. Further, this may of course indicated a malfunction in a heating/cooling system for the battery. Selecting and adapting a battery operation condition may thus comprise heating or cooling the cell. By bringing the cell temperature into the predetermined cell temperature working range by operating a cooling or heating device, the cause of voltage fault condition is counteracted.

A medium severity cause may be current or power overshoot. Hence, the diagnostic test routine may comprise determining whether a current or power withdrawn or applied from or to the cell exceeds a predetermined current or power threshold. The determination may be made for momentaneous withdrawal of current or power, or over a predetermined period of time such as a driving cycle, hours, minutes, or seconds. Stated differently, by determining whether current or power withdrawn from the cell exceeds a predetermined amount instantaneously or over a period of time the cause for the voltage fault condition is determined as current or power overshoot. Hence, a power pulse provided from the battery to the vehicle which exceeds the predetermined parameters is detrimental to the battery.

A medium severity cause may be disturbances on the traction voltage. Hence, the diagnostic test routine may comprise determining whether disturbances on the traction voltage are present. Disturbances on the traction voltage may be from a component with intermittent isolation problems (to ground), or intermittent short circuit pole-pole causing EMC behavior outside the specified traction voltage. Alternatively, components may be going on/off and causing the behavior on the traction voltage not to be according to expectation.

A breakdown severity cause may be a cell failure. Hence, the diagnostic test routine comprises determining whether the cell has failed. The determination whether the cell has failed may be based on the cell reaching both a cell voltage above and below the predetermined voltage range under load, or that the cell reaches has the lowest voltage under load also has the lowest voltage under no load, or that the cell having the highest voltage under load also has the highest voltage under no load. Alternatively, the determination whether the cell has failed may be based whether a cell has a resistance higher than a failure threshold, or whether the capacity of the cell differentiates from the rest of the cells of the battery. A threshold difference in capacity between the cell and the rest of the cell of the battery may be a capacity which is 10% lower than a mean or median value of the capacity of the cells of the battery. The failure threshold of resistance will be floating over life and it will be relative to what it should be at the given time and the actual threshold is in voltage, 2.2 and 4.0V, at a power (current) that should have been possible at that age based on historical or known data.

To summarize, low severity causes of a voltage fault condition may be:

SOH inaccuracy

SOC inaccuracy

SOP inaccuracy cell is unbalanced compared to the rest of the cells of the battery.

Medium severity causes of a voltage fault condition may be:

that the cell temperature is outside a predetermined cell temperature working range, power pulses outside the specification, failures of other components that are exemplified by erratic behavior, disturbances on the traction voltage.

High severity causes of a voltage fault condition may be:

high and low voltage under dynamic load, power pulses outside the specification which have a high amplitude and/or duration.

Breakdown severity causes of a voltage fault condition may be:

cell failure, for example detected viva high and low cell voltage under OCV.

It should be noted that the above list of cause is not exhaustive and should rather be seen as a short list of examples.

If a cause cannot be identified at the severity level of the voltage fault condition, the next step is to search a lower severity level for the cause, as indicated by the arrow A2. Further, the method may also search for additional causes to the voltage fault conditions so that several cause(s) are found if applicable.

It should of course be noted that although the above describes the causes as adhering to a specific severity "level", the causes and/or severity levels may in an alternative embodiment rather be seen as a probability function centered and/or continuous functions around labels. Hence, during operation in a vehicle, or by receiving information from a remote database, such probability functions and/or continuous functions for the causes and severity levels may be updated and adapted.

Even though the present disclosure has been described with reference to specific exemplifying embodiments thereof, many different alterations, modifications and the like will become apparent for those skilled in the art from a study of the drawings, the disclosure, and the appended claims. In addition, in the claims, the word "comprising" does not exclude other elements or steps, and the indefinite article "a" or "an" does not exclude a plurality.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps. Additionally, even though the invention has been described with reference to specific exemplifying embodiments thereof, many different alterations, modifications and the like will become apparent for those skilled in the art. Variations to the disclosed embodiments can be understood and effected by the skilled addressee in practicing the claimed invention, from a study of the drawings, the disclosure, and the appended claims.

The invention claimed is:

1. A method for classifying a voltage fault condition of a battery comprising a plurality of cells for a vehicle, the method comprises:

detecting a cell voltage of one of the cells;

determining that the cell has a voltage fault condition based on the cell voltage being outside a predetermined voltage range;

classifying severity of the voltage fault condition based on the cell voltage;

performing at least one diagnostic test routine, based on the severity of the voltage fault condition, to provide a cause for the voltage fault condition;

selecting and adapting a battery operation condition, based on the severity of the voltage fault condition and the cause, that the battery is enabled to continue to operate the vehicle.

2. The method according to claim 1, wherein the method further comprises increasing the severity of the voltage fault condition based on historical data.

3. The method according to claim 1, wherein the step of classifying the severity of the voltage fault condition further comprises classifying the voltage fault condition to be of low severity, medium severity, high severity or breakdown severity.

4. The method according to claim 1, wherein the method further comprises transmitting adapted control parameter to the vehicle control unit, the control parameters comprising information relating to at least one of: maximum allowable power withdrawal, maximum allowable energy withdrawal.

5. The method according to claim 1, wherein the at least one diagnostic test routine comprises measuring the cell temperature and determining whether the cell temperature is outside a predetermined cell temperature working range.

6. The method according to claim 5, wherein selecting and adapting a battery operation condition comprises heating or cooling the cell.

7. The method according to claim 1, the at least one diagnostic test routine comprises determining whether a current or power withdrawn or applied from or to the cell exceeds a predetermined current or power threshold over a period of time.

8. The method according to claim 1, wherein the at least one diagnostic test routine comprises determining whether the cell is unbalanced compared to the rest of the cells of the battery.

9. The method according to claim 1, wherein the at least one diagnostic test routine comprises determining whether the state of charge, SOC, of the cell is inaccurate.

10. The method according to claim 1, wherein the at least one diagnostic test routine comprises determining whether the cell has failed.

11. The method according to claim 10, wherein the at least one diagnostic test routine comprises determining the state of health, SOH, of the cell is inaccurate.

12. The method according to claim 1, wherein selecting and adapting a battery operation comprises at least one of the following: changing a parameter in control algorithm, charging the cell, discharging the cell, balancing the electrical storage system.

13. The method according to claim 1, wherein the method further comprises the step of transmitting the detected cell voltage, the at least one diagnostic test, the severity, the cause and the battery operation selected or adapted.

14. A computer program product comprising computer program code, wherein the computer program code, when executed by a processor, is configured to perform:

detecting a cell voltage of one of a plurality of cells of a battery;

determining that the cell has a voltage fault condition based on the cell voltage being outside a predetermined voltage range;

classifying severity of the voltage fault condition based on the cell voltage;

performing at least one diagnostic test routine, based on the severity of the voltage fault condition, to provide a cause for the voltage fault condition; and selecting and adapting a battery operation condition, based on the severity of the voltage fault condition and the cause, that the battery is enabled to continue to operate a vehicle.

15. An arrangement for classifying a voltage fault condition of a battery comprising a plurality of cells for a vehicle, the arrangement comprises:

a sensor arranged to detect a cell voltage of at least one of the cells; and a control unit configured to determine that the cell has a voltage fault condition based on the cell voltage being outside a predetermined voltage range, and classify severity of the voltage fault condition based on the cell voltage;

the control unit is further configure to perform at least one diagnostic test routine to provide a cause for the voltage fault condition and adapt a battery operation condition, based on the severity of the voltage fault condition and the cause, that the battery is enabled to continue to operate the vehicle.

16. A vehicle, comprising:

a plurality of cells for the vehicle;

a sensor arranged to detect a cell voltage of at least one of the cells; and a control unit configured to determine that the cell has a voltage fault condition based on the cell voltage being outside a predetermined voltage range, and classify severity of the voltage fault condition based on the cell voltage;

the control unit is further configure to perform at least one diagnostic test routine to provide a cause for the voltage fault condition and adapt a battery operation condition, based on the severity of the voltage fault condition and the cause, that the battery is enabled to continue to operate the vehicle.

* * * * *